(12) United States Patent
Zanbaghi et al.

(10) Patent No.: US 9,397,692 B1
(45) Date of Patent: Jul. 19, 2016

(54) VOLTAGE-CONTROLLED OSCILLATOR (VCO) AS FIRST STAGE IN AN ANALOG-TO-DIGITAL CONVERTER (ADC) IN COMBINATION WITH A DIGITAL FILTER FOR SECOND OR HIGHER-ORDER NOISE SHAPING

(71) Applicant: Cirrus Logic International Semiconductor Ltd., Edinburgh (GB)

(72) Inventors: Ramin Zanbaghi, Austin, TX (US); Aaron Brennan, Austin, TX (US); John L. Melanson, Austin, TX (US)

(73) Assignee: CIRRUS LOGIC INTERNATIONAL SEMICONDUCTOR LTD., Edinburgh (GB)

( * ) Notice: Subject to any disclaimer, the term of this patent is extended or adjusted under 35 U.S.C. 154(b) by 0 days.

(21) Appl. No.: 14/801,620

(22) Filed: Jul. 16, 2015

(51) Int. Cl.
*H03M 1/00* (2006.01)
*H03M 3/00* (2006.01)

(52) U.S. Cl.
CPC .............. *H03M 3/464* (2013.01); *H03M 3/42* (2013.01)

(58) Field of Classification Search
CPC ..... H03M 3/436; H03M 3/412; H03M 3/414; H03M 3/464
USPC .......... 341/155, 110, 144, 118, 120, 122, 143
See application file for complete search history.

(56) References Cited

U.S. PATENT DOCUMENTS

| | | | |
|---|---|---|---|
| 6,353,404 B1 | 3/2002 | Kuroiwa | |
| 2012/0194369 A1* | 8/2012 | Galton | H03M 3/388 341/120 |
| 2012/0223850 A1* | 9/2012 | Su | H03M 1/1265 341/144 |
| 2013/0187803 A1* | 7/2013 | Kaald | H03M 3/37 341/143 |
| 2014/0117955 A1* | 5/2014 | Zoso | H02M 3/157 323/271 |

* cited by examiner

*Primary Examiner* — Peguy Jean Pierre
(74) *Attorney, Agent, or Firm* — Norton Rose Fulbright US LLP

(57) ABSTRACT

A delta-sigma modulation analog-to-digital converter (ADC) may be constructed by combining a VCO used for a first order filter with a digital loop filter used for a second or higher order of the ADC. One such ADC would include an analog input node configured to receive an analog signal; a voltage-controlled oscillator (VCO) comprising a first input configured to receive the analog signal, wherein the voltage-controlled oscillator is configured to implement a first order noise-shaping function; a digital loop filter comprising a second input configured to receive an output of the voltage-controlled oscillator (VCO); and a digital output node configured to output a digital signal based on an output of the digital loop filter. The digital loop filter may be configured to implement at least a first order noise-shaping function, but may also implement higher order noise-shaping functions.

20 Claims, 5 Drawing Sheets

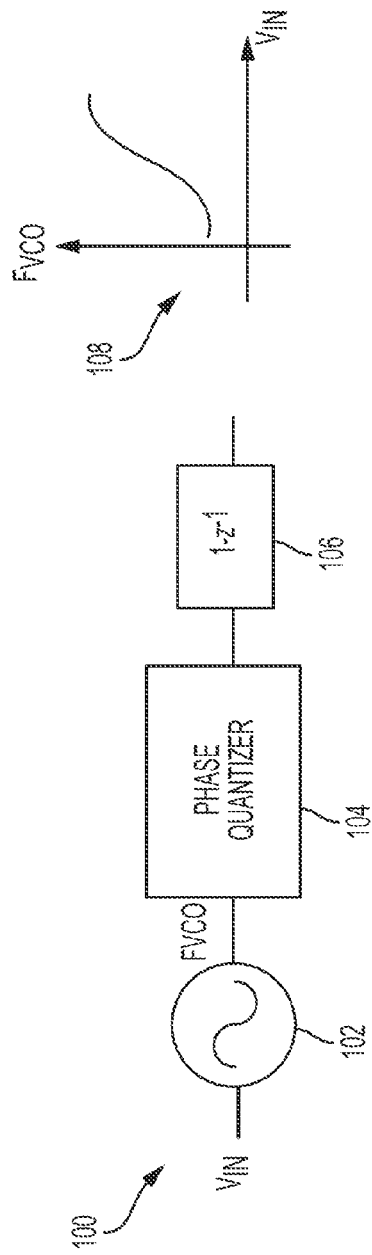
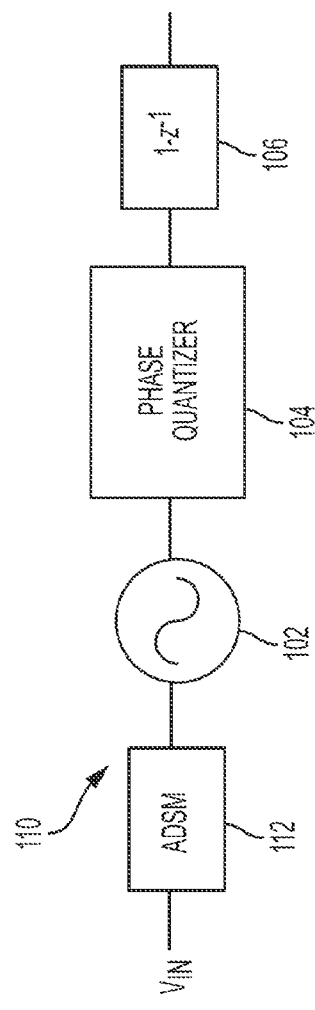
FIG. 1A
PRIOR ART
FIG. 1B
PRIOR ART

VOLTAGE-CONTROLLED OSCILLATOR (VCO) AS FIRST STAGE IN AN ANALOG-TO-DIGITAL CONVERTER (ADC) IN COMBINATION WITH A DIGITAL FILTER FOR SECOND OR HIGHER-ORDER NOISE SHAPING

FIELD OF THE DISCLOSURE

The instant disclosure relates to analog-to-digital converters (ADCs). More specifically, portions of this disclosure relate to voltage-controlled oscillator (VCO)-based ADCs having second or higher-order noise shaping.

BACKGROUND

Delta-sigma modulators are electronic circuits for performing analog-to-digital conversion, digital-to-analog conversion, or digital-to-digital conversion. For example, an analog-to-digital converter (ADC) may convert an analog signal, such as an audio signal, into a digital signal comprising 1's and 0's for processing by digital logic circuitry. Because many consumer-oriented and other electronic device include digital circuitry, such as microprocessors, that performs processing only on digital signals, an analog-to-digital converter (ADC) is an important component of an electronic device. ADCs generally cannot perfectly convert an analog signal into a digital signal. Imperfections in the conversion result in errors in later processes that make use of the digital signal. For example, an audio signal from a microphone may be passed to an analog-to-digital converter (ADC), which converts the audio signal into a digital signal, that digital signal may be provided to a microprocessor for processing, and back to a digital-to-analog converter (DAC) for output to a speaker. The quality of a sound reproduced at the speaker in comparison to the quality of the signal received at the microphone is proportional to the accuracy of the ADC and the DAC.

Some conventional ADCs are based on RC integrator circuits or switched capacitor circuits. However, these types of ADCs generally require higher power, larger die area, and larger voltage headroom to design and manufacture. Available headroom in integrated circuit (IC) design and manufacturing is generally decreasing over time as IC manufacturing allows the size of transistors that make up those ICs to shrink to smaller and smaller sizes. This is because the supply voltage of ICs generally decreases proportional to the size of the transistors. As the supply voltage decreases, any margin of error, or headroom, available decreases as well.

VCO-based ADCs are beneficial, in one example, in electronic devices with low operating voltages. A VCO receives an input analog signal and outputs another analog signal, but the output analog signal has a parameter that is varied by the VCO proportional to the input analog signal. For example, a VCO may receive an input signal $V_{in}$ that has a voltage that varies over time. An output of the VCO may be a signal with a frequency component $f_{VCO}$ that varies proportional to the voltage of the input signal $V_{in}$. Thus, the varying input voltage of $V_{in}$ is translated to a varying frequency $f_{VCO}$ by the VCO.

One such VCO-based ADC is shown in FIG. 1A. FIG. 1A is a block diagram illustrating an example of a conventional VCO-based delta-sigma modulation analog-to-digital converter (ADC). An ADC 100 may include a VCO 102 that receives input signal $V_{in}$. The output of the VCO 102 is provided to a phase quantizer 104, which outputs a digital signal based on a phase of the output of the VCO 102. A rate of change of the phase of the VCO 102 output varies in relation to the frequency of the VCO 102 output. That digital signal from quantizer 104 is then provided to a differentiator 106. The differentiator 106 provides first-order noise shaping on quantization noise added by the ADC 100. However, there is no noise shaping of the input signal $V_{IN}$. Rather, the input to output transfer function of ADC 100 is approximately one.

Some problems with the ADC 100 occur when the input signal $V_{in}$ exceeds a certain range. As shown in graph 108, an output of the VCO 102, $f_{VCO}$, is graphed against the input signal $V_{in}$. An ideal behavior for a VCO 102 is linear behavior, which occurs in the middle of the curve in graph 108. At the edges of the line in graph 108, non-linear behavior in the VCO 102 occurs. If an input signal $V_{in}$ enters these ranges, the digital signal representation of the analog signal becomes distorted. In addition to the non-linearity of the VCO 102 that are exposed to the input signal $V_{in}$ the ADC 100 is only of a single order.

One conventional VCO-based ADC improves upon this situation by converting the input signal $V_{in}$ to a pulse width modulated (PWM) signal prior to the VCO. FIG. 1B is a block diagram illustrating an example of a conventional VCO-based delta-sigma analog-to-digital converter (ADC) in which the input to the VCO is a pulse width modulation input. An ADC 110 includes an asynchronous delta-sigma modulator (ADSM) 112 coupled before the VCO 102, the phase quantizer 104, and the differentiator 106. The output of the ADSM 112 is a square wave signal with a fixed peak-to-peak voltage. The peaks of the square wave signal are selected to be at distant edges of the line in graph 108. Thus, the VCO 102 only receives as an input signal one of two voltages. Because it only receives two voltages, the VCO 102 by definition exhibits linear behavior because the only graph that can be completely represented with two points is a line. Although the use of ADSM 112 may prevent the VCO 102 from experiencing non-linearity, the problem is only moved to the ADSM 112. Further, the ADSM 112 is an additional component to manufacture, and the ADC 110 is still only of a single order.

Another conventional solution to the problem of the non-linearity in the VCO-based ADC of FIG. 1A is to implement a negative feedback loop. FIG. 1C is a block diagram illustrating an example of a conventional VCO-based delta-sigma analog-to-digital converter (ADC) having a negative feedback loop. An ADC 120 includes a negative feedback loop 126 from the output of the phase quantizer 104 to a subtractor 122. The feedback loop 126, which starts as a digital signal at the output of the phase quantizer 104, may be converted to an analog signal by DAC 124 for input to the subtractor 122. The subtractor 122 produces an error signal for input to the VCO 120, and that error signal generally has a smaller peak-to-peak voltage than that of the input signal $V_{in}$ when a DAC 124 is a multi-bit DAC, and the amplitude of that error signal may also be proportional to resolution of the DAC 124. Thus, referring back to the line in graph 108 of FIG. 1A, it is much more likely that the input provided to the VCO 102 remains in the linear region of graph 108. Although the use of negative feedback loop 126 can improve the output of ADC 120, the ADC 120 is still only of a first order.

Higher order noise-shaping improves the quality of an ADC by better attenuating noise in the input signal. Thus, higher order delta-sigma modulation in an ADC is desirable. However, higher orders than first order VCO-based ADCs have not been designed. In fact, cascading VCO together to obtain higher order modulation would not be feasible. Because the VCO converts analog voltage to phase information, a second VCO cannot be coupled to the output of the first VCO, because the output of the first VCO is not the analog voltage information needed at the second VCO. Although additional circuitry could be implemented to convert the phase output of the first VCO to an analog voltage for the second VCO, such additional circuitry would make the resulting converter undesirable due to size and power consumption.

Shortcomings mentioned here are only representative and are included simply to highlight that a need exists for improved electrical components, particularly for ADCs employed in consumer-level devices, such as mobile phones. Embodiments described herein address certain shortcomings but not necessarily each and every one described here or known in the art.

SUMMARY

Higher order voltage-controlled oscillator (VCO)-based analog-to-digital converters (ADCs) may be designed by using digital loop filter components at an output of the VCO of the ADC. Digital loop filter components may be implemented with digital gates in integrated circuits (ICs). These digital gates are easier to manufacture and implement in an ADC and have limited distortion compared to other analog-based circuitry. In particular, digital gates scale better to lower voltage operation at the smaller transistor sizes created by improved IC manufacturing.

In one embodiment, a VCO of the ADC may be used to convert a voltage domain analog input signal to a time domain digital signal for processing by the digital loop filter components. Although improving IC manufacturing technologies may result in lower voltages, the lower voltages will generally only limit components operating in the voltage domain. By converting the information in the input signal from the voltage domain to the time domain and performing processing in the digital domain, the effects of the lower voltages of improved IC manufacturing technologies is decreased. Additionally in certain embodiments, the VCO may be implemented as a ring oscillator with digital gates, such that a large portion of the ADC is implemented with digital gates.

Reducing analog components, by using a digital loop filter for second and higher orders, may allow easier and faster synthesis of the disclosed circuits. Further, manufactured ICs with these converters provide reduced area, lower power consumption, better portability, and more programmability than conventional analog circuitry, such as that described in the background above.

Further, the digital loop filter components may be used to obtain higher order ADCs. Higher order quantization improves the conversion of accuracy of a delta-sigma modulation-based converter. Although other higher order delta-sigma modulators for analog-to-digital conversion exist, those conventional modulators are based on R-C integrator circuits, switched capacitor circuits, or Gm-C integrator circuits. These circuits require operational amplifiers (or op amps) that have degrading performance as IC manufacturing process technology improves and the transistor size is decreased.

The combination of the VCO-based first stage of the ADC and the digital loop filter second stage may include two-step quantization. The first quantization may be performed on the output of the VCO in the first stage. A second quantization may be performed at the output of the digital loop filter. A more accurate ADC may be obtained by implementing the digital loop filter components at a higher number of bits. When the number of bits of quantization in the digital loop filter components is higher than the number of bits of quantization at the output of the ADC, the digital loop filter components may be considered as operating in the analog domain even though they are digital components. Thus, accuracy in conversion of the analog signal to digital signal may be improved. In particular, an output of a first quantization on the VCO output may provide very high accuracy and resolution that exceeds a resolution of a feedback DAC in the ADC. A second quantizer at the output of the digital filter that truncates the resolution may limit improved accuracy of the ADC; however, the additional noise shaping provided by the digital loop filter can reduce truncation quantization noise.

According to one embodiment, an apparatus may include an analog input node configured to receive an analog signal; a voltage-controlled oscillator (VCO), such as a ring oscillator, comprising a first input configured to receive the analog signal, wherein the voltage-controlled oscillator is configured to implement a first order noise-shaping function; a digital loop filter comprising a second input configured to receive an output of the voltage-controlled oscillator (VCO), wherein the digital loop filter is configured to implement at least a first order noise-shaping function; and/or a digital output node configured to output a digital signal based on an output of the digital loop filter.

In certain embodiments, the apparatus may include a first quantizer configured to receive a signal, such as digital pulse data, from the voltage-controlled oscillator (VCO) and/or a second quantizer configured to receive an output of other digital loop filter components; the first quantizer may operate at a first resolution; the second quantizer may operate at a second resolution lower than the first resolution; the first quantizer may include a first counter configured to receive a first component of a differential signal received at the analog input node, a first sampler configured to receive an output of the first counter and to sample the output of the first counter, a second counter configured to receive a second component of the differential signal received at the analog input node, a second sampler configured to receive an output of the second counter and to sample the output of the second counter, and/or a summer configured to receive an output of the first sampler and an output of the second sampler and calculate a difference; the apparatus may include a feedback loop coupled to the digital output node and coupled to the VCO, wherein the VCO receives an error signal based, at least in part, on the feedback loop and the received analog signal; the VCO may include an input stage with a voltage-to-current conversion stage configured to receive the analog signal and convert a voltage of the analog signal to a current signal and/or a current controlled oscillator (ICO) coupled to the voltage-to-current conversion stage to receive the current signal, wherein an output of the current controlled oscillator (ICO) is based, at least in part, on the current signal; and/or the apparatus comprises a delta-sigma modulator analog-to-digital converter (ADC).

According to another embodiment, a method may include receiving at an analog input node an analog signal for conversion to a digital signal; integrating an analog error signal in a first stage of a delta-sigma modulator with a voltage controlled oscillator (VCO), such as a ring oscillator, that implements a first order noise-shaping function, wherein the analog error signal is a difference between the input analog signal and an output of a feedback DAC coupled to an output of the second quantizer; and/or integrating an output of the first stage in the second stage of the delta-sigma modulator with a digital loop filter to obtain the digital signal, wherein the digital loop filter is configured to implement at least a first order noise-shaping function.

In some embodiments, the method may also include converting an output of the voltage controlled oscillator to an intermediate digital signal by quantizing an output of the voltage controlled oscillator (VCO); quantizing an output of the second stage to produce the digital signal; integrating an output of the second stage in a third stage of a delta-sigma modulator, wherein the second stage and the third stage are both implemented in a digital domain; quantizing the VCO output signal, such as a time domain digital pulse signal, to produce an intermediate digital signal provided to the second stage of the delta-sigma modulator; and/or further comprising quantizing an output of the second stage to produce the digital signal.

In certain embodiments, the quantizing the output of the voltage controlled oscillator is performed at a higher resolution than the quantizing the output of the digital loop filter; the delta-sigma modulator is at least a second order delta-sigma modulator; and/or the step of integrating the analog signal in a first stage may include the steps of converting the analog error signal from a voltage domain error signal to a current domain error signal, applying the current domain error signal to a current controlled oscillator (ICO), and/or converting the current domain error signal to a signal that has a frequency component, such as a frequency-varying time domain pulse, by the current controlled oscillator.

According to another embodiment, a delta-sigma modulator analog-to-digital converter (ADC) of at least a second order may include an input node configured to receive an analog signal for conversion to a digital signal; a first stage implemented in an analog domain and comprising a voltage controlled oscillator (VCO); a first quantizer configured to receive an output of the voltage-controlled oscillator (VCO); a second stage implemented in a digital domain and coupled to the first quantizer, and the second stage comprising components of a digital loop filter; a second quantizer configured to receive an output of the second stage; and/or an output node coupled to the second quantizer and configured to output the digital signal. In some embodiments, the apparatus may also include a feedback loop coupled to the digital output node and to at least one switch coupled to the analog input node.

In certain embodiments, the first quantizer may operate at a first resolution, and the second quantizer may operate at a second resolution lower than the first resolution; the first quantizer may include a first counter configured to receive a first component of a differential signal received at the analog input node, a second counter configured to receive a second component of the differential signal received at the analog input node, and/or a summer configured to receive an output of the first counter and an output of the second counter and calculate a difference; and/or the voltage controlled oscillator may include an input stage, a voltage-to-current conversion stage configured to receive the analog signal and convert a voltage of the analog signal to a current signal, and/or a current controlled oscillator (ICO) coupled to the voltage-to-current conversion stage to receive the current signal, wherein an output of the current controlled oscillator (ICO) is based, at least in part, on the current signal.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 1A is a block diagram illustrating an example of a conventional VCO-based delta-sigma analog-to-digital converter (ADC).

FIG. 1B is a block diagram illustrating an example of a conventional VCO-based delta-sigma analog-to-digital converter (ADC) in which the input to the VCO is a pulse width modulation input.

DETAILED DESCRIPTION

Figure 1C:
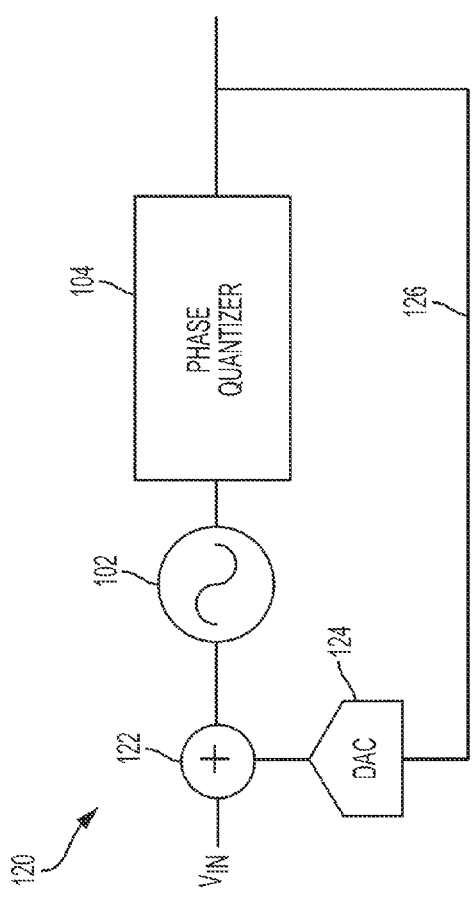
FIG. 1C is a block diagram illustrating an example of a conventional VCO-based delta-sigma analog-to-digital converter (ADC) having a negative feedback look.
Figure 2:
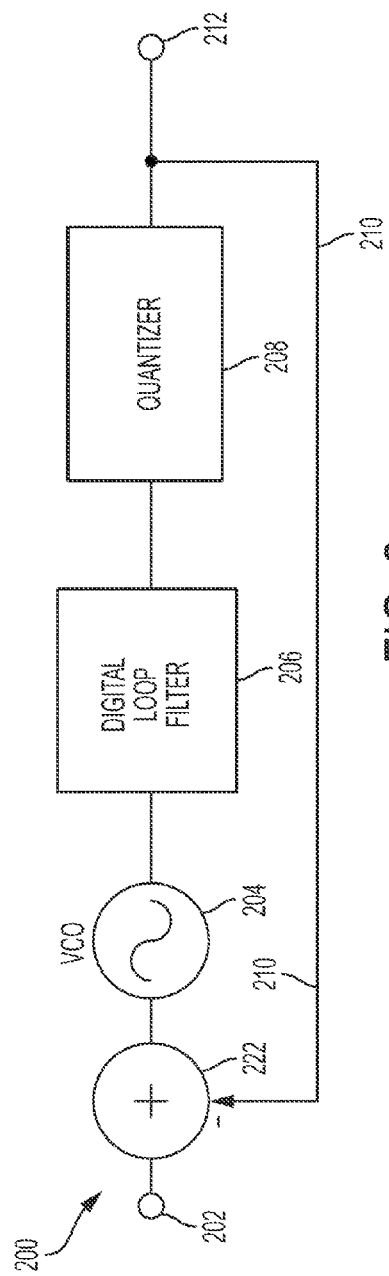
FIG. 2 is a block diagram illustrating a delta-sigma analog-to-digital converter (ADC) based on a voltage-controlled oscillator (VCO) and a digital loop filter according to one embodiment of the disclosure.

FIG. 2 is a block diagram illustrating a delta-sigma analog-to-digital converter (ADC) based on a voltage-controlled oscillator (VCO) and a digital loop filter according to one embodiment of the disclosure. An analog-to-digital (ADC) converter 200 may include an input node 202 for receiving an analog signal for conversion to a digital signal. The input node 202 may be coupled to a voltage-controlled oscillator (VCO) 204 that receives the input analog signal from input node 202. The VCO 204 may output an oscillating analog signal, in which at least one aspect of the VCO 204 output is proportional to the voltage of the input signal received by the VCO 204. For example, a frequency of digital pulses generated by the VCO 204 may be based, at least in part, on the voltage of the input signal received at input node 202.

In one embodiment, a feedback loop 210 may also be coupled to an input of the VCO 204 through an adder 222, such that the output of the VCO 204 is only partially dependent on the input signal at the input node 202. The adder 222 may be configured to subtract the value of the feedback loop 210 from the value of at the input node 202. By combining the feedback 210 with the input signal received at input node 202, the VCO 204 may be controlled by an analog error signal. In this configuration, the variation in input to the VCO 204 may be reduced and the VCO 204 may be more likely to remain in its linear operation region.

The VCO 204 may function as an integrator to implement a first order noise-shaping function in the analog domain. As described in the background section, conventional VCO-based ADCs are limited to first-order noise shaping, among other short-comings. However, the output of the VCO 204 may be coupled to a digital loop filter 206, which may function as a second integrator to implement at least a first order noise-shaping function. The digital loop filter 206 and the VCO 204 together implement at least second-order delta-sigma modulator. The digital loop filter 206 may implement higher N-order noise-shaping functions, such that the order of the ADC 200 is N+1. The output of the digital loop filter 206 may be provided to a quantizer 208, which outputs a digital signal to an output node 212.

Figure 3:
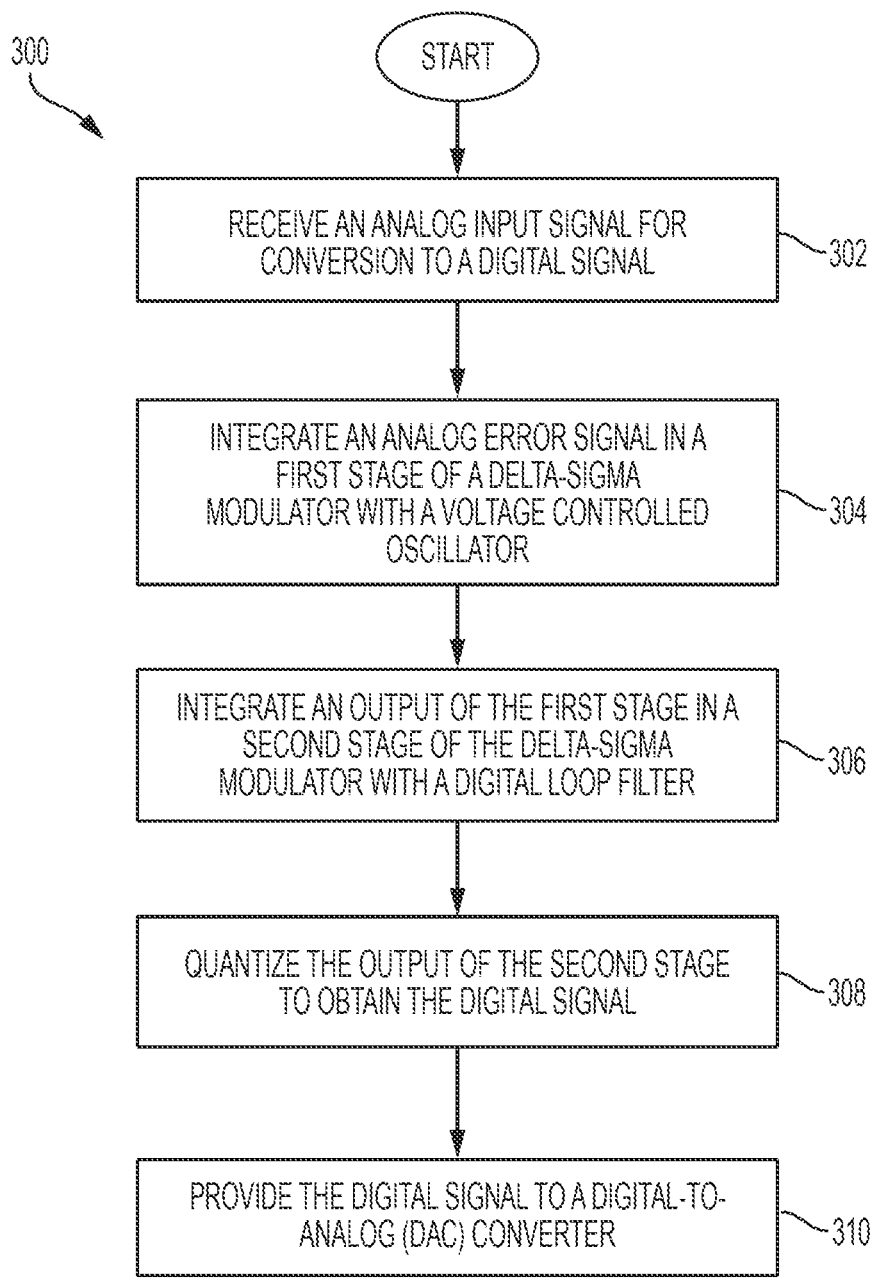
FIG. 3 is a flow chart illustrating a method of converting analog signals to digital signals with a voltage-controlled oscillator (VCO)-based analog-to-digital converter (ADC) according to one embodiment of the disclosure.

The VCO-based ADC 200 of FIG. 2 may be operated to convert analog signals, such as audio signals, to a digital signal. The audio signals may be processed as digital signals in the digital domain. The audio signals may then be converted back to an analog signal, such as for output to a speaker or headphones, by a digital-to-analog converter (DAC). One method of operation for a VCO-based ADC is shown in the flow chart of FIG. 3. FIG. 3 is a flow chart illustrating a method of converting analog signals to digital signals with a voltage-controlled oscillator (VCO)-based analog-to-digital converter (ADC) according to one embodiment of the disclosure. A method 300 may begin at block 302 with receiving an analog input signal for conversion to a digital signal. This analog signal may include, for example, an audio signal received from a microphone or received from a wireless radio. Then, at block 304, an analog error signal corresponding to the received analog input signal may be integrated in a first stage of a delta-sigma modulator with a VCO. For example, the VCO 204 of FIG. 2 or other embodiments illustrated herein, may perform the integration step of block 302. The analog error signal may be calculated as a difference between the analog signal and a feedback loop from a second stage of the ADC, which may pass through a digital-to-analog converter (DAC) before being provided to the VCO 204.

After the integration of the analog error signal in the first stage of the delta-sigma modulator to obtain a first integrated signal, the first integrated signal may be provided to a second stage of the ADC, which may include digital loop filter 206 of FIG. 2. The second stage may perform the step of block 306 for integrating the output of the first stage with the digital loop filter. Although not shown, additional steps of successive integration in additional stages may be performed to obtain higher-order, or N-order, noise-shaping in the delta-sigma modulator. The output of the second stage may then be quantized at block 308 to obtain the digital signal representation of the input analog signal received at block 302. Next, the digital signal output after quantization at block 308 may be fed back to the input of the delta-sigma modulator, such as through a digital-to-analog converter (DAC), at block 310. The digital signal output from the quantization at block 308 may also be provided to other components for processing in the digital domain, or conversion back to an analog signal by a DAC for a speaker or headphone output. In one embodiment, the digital domain processing may include, for example, voice detection and voice command recognition.

Figure 4:
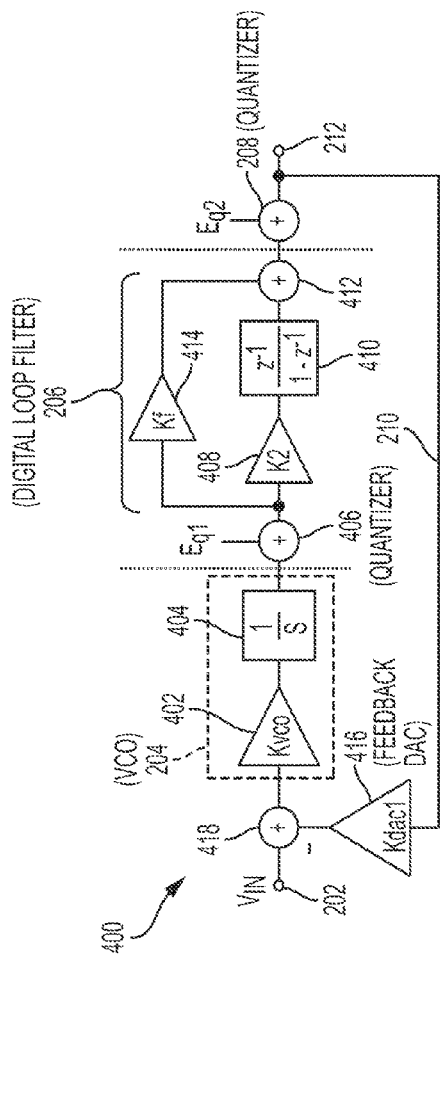
FIG. 4 is a system-level block diagram of a delta-sigma analog-to-digital converter (ADC) based on a voltage-controlled oscillator (VCO) and a digital loop filter according to one embodiment of the disclosure.

A system-level block diagram according to one embodiment of the analog-to-digital converter (ADC) shown in FIG. 2 is illustrated in FIG. 4. FIG. 4 is a system-level block diagram of a delta-sigma analog-to-digital converter (ADC) based on a voltage-controlled oscillator (VCO) and a digital loop filter according to one embodiment of the disclosure. An ADC 400 includes the analog input node 202 coupled through an adder 418 to the VCO 204. The VCO 204 includes digital gain 402, having an amplification factor $K_{VCO}$, and a first order filter 404. The output of the VCO 204 is provided to a quantizer 406. The quantizer 406 may combine the output of VCO 204 with an $E_{q1}$ signal that represents the quantization error of the quantizer 406. The output of the quantizer 406 is provided to the digital loop filter 206 including a digital gain 408, having amplification factor $K_2$, then to a noise filter 410 and an adder 412. Digital gain 414, having an amplification factor $K_f$, provides feedback from the adder 412 to the digital gain 408. The output of the adder 412 is also provided to the digital loop quantizer 208, which also adds to the output an $E_{q2}$ signal that represents the quantization error of the quantizer 208.

The feedback loop 210 couples the output of the quantizer 208 to the input of the VCO 204 through the adder 418. A digital-to-analog converter (DAC) 416 may be used to convert the digital output of the quantizer 208 to an analog signal to be processed with the analog input signal $V_{in}$ received at node 202. The adder 418 may subtract the feedback signal of feedback loop 210 from the analog input signal $V_{in}$ received at node 202 to generate an error signal that is provided to the VCO 204. By generating the error signal, the peak-to-peak variation of the input to the VCO 204 may be reduced as compared to the peak-to-peak variation of the analog signal $V_{in}$. In one embodiment, the ADC 400 may implement a second-order delta-sigma modulator by setting the coefficients $K_{VCO}=1$, $K_2=1$, and $K_f=2$.

Figure 5:
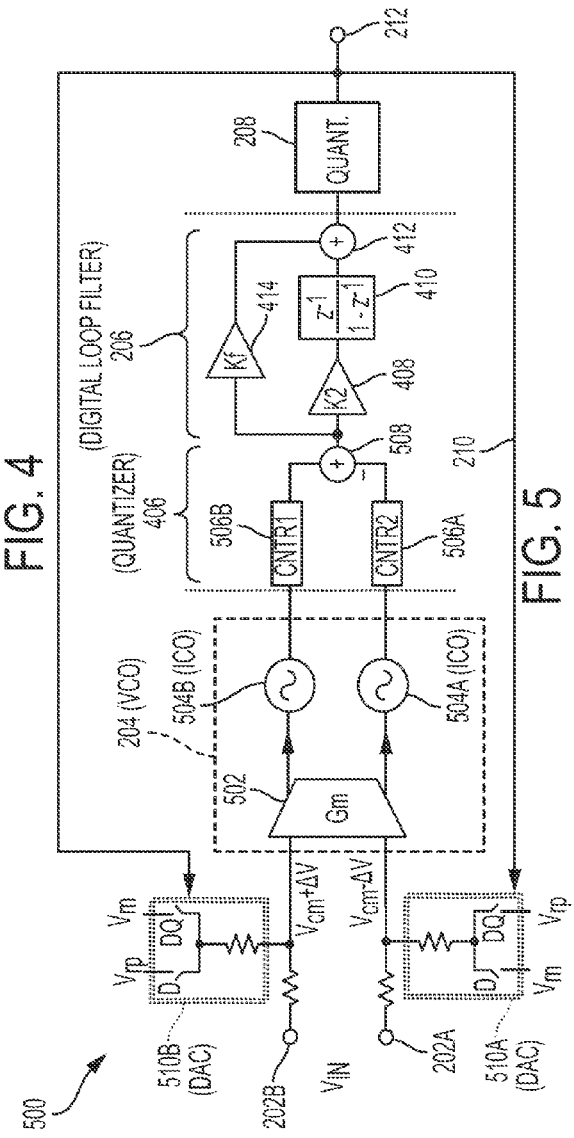
FIG. 5 is a circuit schematic showing a second-order delta-sigma analog-to-digital converter (ADC) based on a voltage-controlled oscillator (VCO) and a digital loop filter according to one embodiment of the disclosure.

One embodiment of an analog-to-digital converter (ADC) based on the system-level block diagram of FIG. 4 is shown in FIG. 5. In particular, in one embodiment, the VCO 402 may be implemented by converting the voltage-based input signal to a current-based input signal and providing the current-based signal to current-controlled oscillators (ICOs). FIG. 5 is a circuit schematic showing a second-order delta-sigma analog-to-digital converter (ADC) based on a voltage-controlled oscillator (VCO) and a digital loop filter according to one embodiment of the disclosure. An ADC 500 may include analog input nodes 202A and 202B in a differential configuration. Although a differential input signal is shown in FIG. 5, the ADC 500 may also be implemented with a single input signal configuration. The analog input signal received at the nodes 202A-B may be a signal with varying voltage representing the information, such as the audio. That voltage-based input signal may be provided to a transconductance stage $G_m$ 502, which converts the voltage-based input signal to a current-based signal. The input to stage 502 includes a signal containing a common-mode voltage $V_{cm}$ and the analog information contained in a $\Delta V$ signal added to the common-mode voltage $V_{cm}$. The output of the transconductance stage 502 is provided in a differential manner to the ICOs 504A-B. The transconductance stage 502 includes a $V_{cm}+\Delta V$ signal from the input node 202B and a $V_{cm}-\Delta V$ signal from the input node 202A. The transconductance stage 502 then outputs an $I_{cm}+\Delta I$ signal to the ICO 504B and an $I_{cm}-\Delta I$ signal to the ICO 504A. The output of the ICOs 504A-B are a signal with the information contained in $\Delta F$ components of signals that was previously contained in the $\Delta V$ and $\Delta I$ components of the input signal. In particular, the output of ICO 504A is a sum of a common-mode frequency $f_{CM}$ and the $\Delta F$ signal, $f_{CM}-\Delta F$, and the output of ICO 504B is $f_{CM}+\Delta F$.

Those outputs of ICOs 504A-B may be provided to counters 506A and 506B. The counters 506A-B count a number of transitions at the output of the ICOs 504A-B in a defined time period. The results of the counters 506A-B may be subtracted at adder 508 to obtain a signal that is proportional to the signal at the input of the transconductance stage 502. The counters 506A-B and the adder 508 may act as the first quantizer 406 in the ADC 500 by converting the information from ICOs 504A-B to digital counts. The output of adder 508 is provided to the digital loop filter 206 including the digital gain 408, the noise filter 410, and the adder 412, and then to the digital gain 414, and the quantizer 208.

The output of the quantizer 208 at output node 212 may be a digital signal representation of the analog input signal received at nodes 202A-B. The feedback loop 210 provides the digital output of the quantizer 208 to digital-to-analog converters (DACs) 510A and 510B. In one embodiment, the DACs 510A and 510B may be resistive DACs as shown in FIG. 5. The feedback DACs 510A and 510B may alternatively be other forms of DACs. The combination of the analog input signal received at nodes 202A and 202B and the feedback signal provided through the DACs 510A and 510B, respectively, produces an error signal at the input of the transconductance stage 502. In this embodiment, the transconductance stage 502 receives only a difference between input signal $V_{in}$ and feedback signal. Thus, the transconductance stage 502 is not exposed to the full swing of input signal $V_{in}$.

In one embodiment, the digital loop filter 206 may be implemented with a different level of digital accuracy than the quantizer 208 and the feedback loop 210. For example, the digital loop filter 206 may be implemented with 10-bit digital logic and the quantizer 208 may be implemented with 8-bit digital logic. In such a configuration, the quantizer 208 operates to truncate the digital output of the digital loop filter 206. By operating the digital loop filter 206 at a higher accuracy than the quantizer 208, the digital loop filter 206, despite being implemented in the digital domain, appears to the quantizer 208 to have the accuracy of a continuous analog domain.

Figure 6:
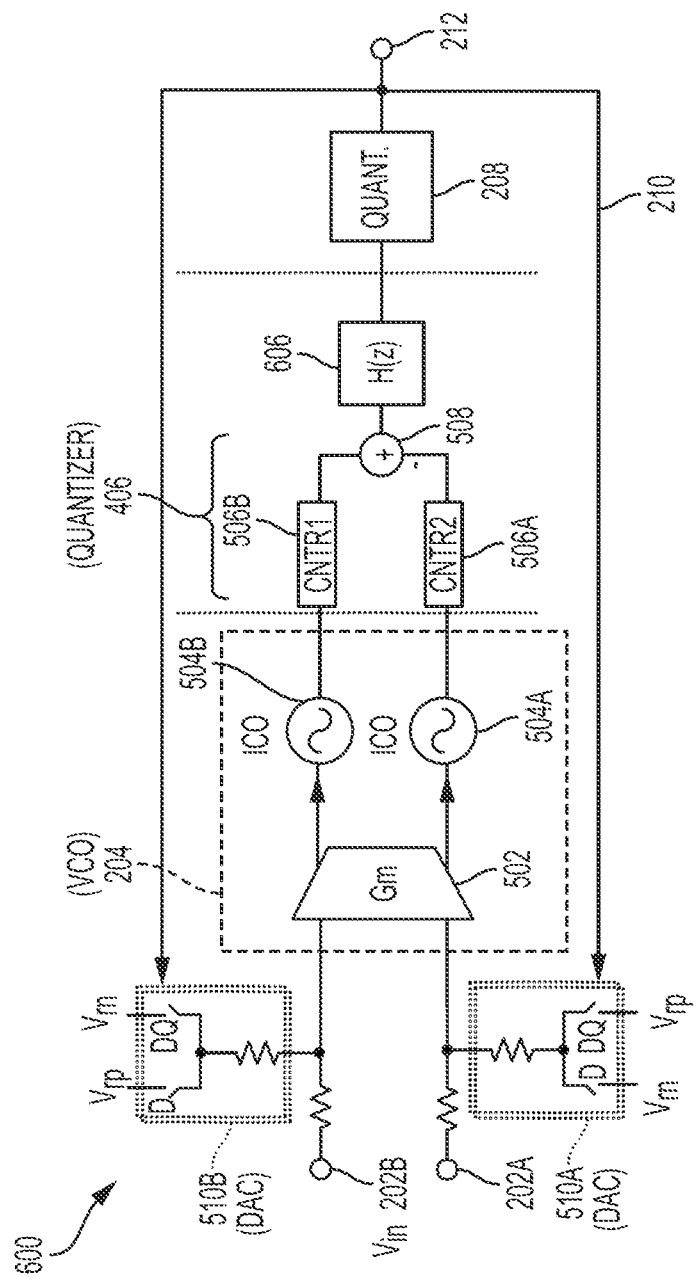
FIG. 6 is a circuit schematic showing an N-order delta-sigma analog-to-digital converter (ADC) based on a voltage-controlled oscillator (VCO) and a digital loop filter according to one embodiment of the disclosure.

FIGS. 2, 3, 4, and 5 above describe implementation of a second-order delta-sigma modulator for analog-to-digital conversion. However, the converter design may be adapted to implement an arbitrary N-th order noise-shaping function. FIG. 6 is a circuit schematic showing an N-order delta-sigma analog-to-digital converter (ADC) based on a voltage-controlled oscillator (VCO) according to one embodiment of the disclosure. FIG. 6 is similar to FIG. 5, but replaces components of the digital loop filter 206 with a generic noise-shaping transfer function H(z) block 606. The transfer function block 606 may be designed to be an N-order noise shaping function having, for example, second order, third order, fourth order, or more order noise shaping. The overall order of ADC 600 is thus N+1, where N is the order of the transfer function H(Z) block 606. The first order of ADC 600 is implemented with the VCO 204, and additional higher orders are implemented in transfer function H(Z) block 606.

The schematic flow chart diagram of FIG. 3 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
    an analog input node configured to receive an analog signal;
    a voltage-controlled oscillator (VCO) comprising a first input configured to receive the analog signal, wherein the voltage-controlled oscillator is configured to implement a first order noise-shaping function;
    a first quantizer configured to receive a signal from the VCO;
    a digital loop filter comprising a second input configured to receive a digital output of the first quantizer, wherein the digital loop filter is configured to implement at least a first order noise-shaping function; and a digital output node configured to output a digital signal based on an output of the digital loop filter, wherein the digital signal is a digital representation of the received analog signal.

2. The apparatus of claim 1, further comprising:
a second quantizer configured to receive an output of the digital loop filter, wherein the digital output node is configured to output a value from the second quantizer.

3. The apparatus of claim 2, wherein the first quantizer operates at a first resolution, and wherein the second quantizer operates at a lower second resolution.

4. The apparatus of claim 2, wherein the first quantizer comprises:
a first counter configured to receive a first component of a differential signal received at the analog input node;
a second counter configured to receive a second component of the differential signal received at the analog input node; and
an adder configured to receive an output of the first counter and an output of the second counter and calculate a difference.

5. The apparatus of claim 1, further comprising:
a feedback loop coupled to the digital output node and coupled to the VCO; and
a digital-to-analog converter (DAC) coupled to the feedback loop and the VCO,
wherein the VCO receives an error signal based, at least in part, on an output of the DAC and the received analog signal.

6. The apparatus of claim 1, wherein the voltage controlled oscillator comprises an input stage comprising:
a voltage-to-current conversion stage configured to receive the analog signal and convert a voltage of the analog signal to a current signal; and
a current controlled oscillator (ICO) coupled to the voltage-to-current conversion stage to receive the current signal, wherein an output of the current controlled oscillator (ICO) is based, at least in part, on the current signal.

7. The apparatus of claim 1, wherein the apparatus comprises a delta-sigma modulator analog-to-digital converter (ADC).

8. A method, comprising:
receiving at an analog input node an analog signal for conversion to a digital signal;
integrating an analog error signal in a first stage of a delta-sigma modulator with a voltage controlled oscillator (VCO) that implements a first order noise-shaping function, wherein the analog error signal is a difference between the analog signal and an output of a second stage of the delta-sigma modulator;
integrating an output of the first stage in the second stage of the delta-sigma modulator with a digital loop filter to obtain the digital signal, wherein the digital loop filter is configured to implement at least a first order noise-shaping function; and
quantizing an output of the digital loop filter to obtain the digital signal representation of the analog signal.

9. The method of claim 8, further comprising converting an output of the voltage controlled oscillator to an intermediate digital signal by quantizing an output of the voltage controlled oscillator (VCO).

10. The method of claim 9, wherein the step of quantizing the output of the voltage controlled oscillator is performed at a higher resolution than the quantizing the output of the digital loop filter.

11. The method of claim 8, wherein the delta-sigma modulator is at least a second order delta-sigma modulator.

12. The method of claim 8, further comprising integrating an output of the second stage in a third stage of a delta-sigma modulator, wherein the second stage and the third stage are both implemented in a digital domain.

13. The method of claim 8, wherein the step of integrating the analog signal in a first stage comprises the steps of:
converting the analog error signal from a voltage domain error signal to a current domain error signal;
applying the current domain error signal to a current controlled oscillator (ICO); and
converting the current domain error signal to a frequency domain signal by the current controlled oscillator.

14. The method of claim 13, further comprising quantizing the frequency domain signal to produce an intermediate digital signal provided to the second stage of the delta-sigma modulator.

15. The method of claim 8, further comprising feeding the digital signal to a digital-to-analog converter (DAC) for combination with the analog signal to generate the analog error signal for input to the VCO.

16. A delta-sigma modulator analog-to-digital converter (ADC) of at least a second order, comprising:
an input node configured to receive an analog signal for conversion to a digital signal;
a first stage implemented in an analog domain and comprising a voltage controlled oscillator (VCO);
a first quantizer configured to receive an output of the voltage-controlled oscillator (VCO);
a second stage implemented in a digital domain and coupled to the first quantizer, wherein the second stage comprises components of a digital loop filter;
a second quantizer coupled to the second stage and configured to generate the digital based, at least in part, on the output of the second stage; and
an output node coupled to the second quantizer and configured to output the digital signal.

17. The apparatus of claim 16, wherein the first quantizer operates at a first resolution, and wherein the second quantizer operates at a lower second resolution.

18. The apparatus of claim 16, wherein the first quantizer comprises:
a first counter configured to receive a first component of a differential signal generated based, at least in part, on the first stage;
a second counter configured to receive a second component of the differential signal generated based, at least in part, on the first stage; and
an adder configured to receive an output of the first counter and an output of the second counter and calculate a difference.

19. The apparatus of claim 16, further comprising a feedback loop coupled to the digital output node and to the first stage to generate an error signal for input to the VCO.

20. The apparatus of claim 16, wherein the voltage controlled oscillator (VCO) comprises an input stage comprising:
a voltage-to-current conversion stage configured to receive the analog signal and convert a voltage of the analog signal to a current signal; and
a current controlled oscillator (ICO) coupled to the voltage-to-current conversion stage to receive the current signal, wherein an output of the current controlled oscillator (ICO) is based, at least in part, on the current signal.

* * * * *